US006154161A

United States Patent [19]

Leme et al.

[11] Patent Number: 6,154,161

[45] Date of Patent: Nov. 28, 2000

[54] INTEGRATED AUDIO MIXER

[75] Inventors: Carlos Azeredo Leme, Lisboa, Portugal; Christian Dupuy, Trets, France; Jose Epifanio da Franca, Lisboa, Portugal

[73] Assignee: Atmel Corporation, San Jose, Calif.

[21] Appl. No.: 09/168,223

[22] Filed: Oct. 7, 1998

[51] Int. Cl.[7] .................... H03M 3/00

[52] U.S. Cl. .................... 341/143; 341/155

[58] Field of Search .................... 341/143, 155, 341/200, 141

[56] References Cited

U.S. PATENT DOCUMENTS

| | | | |
|---|---|---|---|
| 5,117,234 | 5/1992 | Shizawa | 341/143 |
| 5,150,120 | 9/1992 | Yunus | 341/143 |
| 5,345,236 | 9/1994 | Sramek, Jr. | 341/144 |
| 5,363,101 | 11/1994 | Ueki | 341/143 |
| 5,438,623 | 8/1995 | Begault | 381/17 |
| 5,483,528 | 1/1996 | Christensen | 370/62 |
| 5,550,544 | 8/1996 | Sakiyama et al. | 341/155 |
| 5,561,425 | 10/1996 | Therssen | 341/143 |
| 5,589,830 | 12/1996 | Linz et al. | 341/110 |
| 5,647,008 | 7/1997 | Farhangi et al. | 381/119 |
| 5,729,225 | 3/1998 | Ledzius | 341/61 |
| 5,751,615 | 5/1998 | Brown | 364/724.1 |
| 5,774,567 | 6/1998 | Heyl | 381/119 |
| 5,835,044 | 11/1998 | Nishino | 341/143 |

OTHER PUBLICATIONS

The ARRL Handbook For Radio Amateurs, 74th Edition, 1997, pp. 15.1–15.3.

The ARRL Handbook For Radio Amateurs, 74th Edition, 1997, pp. 18.1–18.18.

M. Ismail et al., Analog VLSI: Signal and Information Processing 1994, pp. 467–505.

*Primary Examiner*—Peguy JeanPierre
*Attorney, Agent, or Firm*—Thomas Schneck

[57] ABSTRACT

An integrated, multi-input audio mixer receiving a plurality of analog input signals, internally digitizing the analog input signals, digitally processing and mixing the digitized input signals and producing both digital and analog representations of the mixed inputs. All analog inputs are applied to half of a full delta-sigma analog-to-digital converter. That is, each input is applied to a respective delta-sigma modulator, but all the delta-sigma modulators share a single sigma-decimation filter. The output of each delta/sigma modulator controls a respective multiplexer having a separate input channel for each quantization level of its respective delta/sigma modulator. The output of the multiplexers is selectively applied to a summing circuit. The output from the summing circuit is applied to a D/A converter to provide an analog output, and is also applied to the single sigma-decimation filter, which recovers the mixed data from the delta/sigma modulators.

19 Claims, 6 Drawing Sheets

INTEGRATED AUDIO MIXER

FIELD OF THE INVENTION

The invention relates to integrated audio mixers for digitally mixing multiple analog input signals.

BACKGROUND OF THE INVENTION

There are two basic types of mixing circuits in the electronic art. The first is a heterodyne mixing circuit, which combines the energy of two input signals by multiplying their instantaneous voltages to produce an output signal having new frequency components. The second type is what is often referred to as an audio mixer, which generates a linear sum of multiple input signals. The audio mixer is often used for combining multiple voice and music sources.

With reference to FIG. 1, a basic audio mixer 9 has multiple analog inputs Ain1–Ain3 applied to separate gain stages 11–15, respectively. Gain stages 11–15 adjust the weight of each input and are typically implemented as fixed or variable analog amplifiers. The outputs from gain stages 11–15 are applied to an analog summer 17 that produces a weighted linear sum of analog inputs Ain1–Ain3. A further discussion of audio mixers is found in *The ARRL Handbook*, 74th Edition, 1997, pages 15.1–15.3. If desired, analog output Aout may be applied to an analog-to-digital converter, A/D, 21 to produce a digital output Dout. A similar audio mixer is found in U.S. Pat. No. 5,589,830 to Linz et al.

The structure of FIG. 2 builds on that of FIG. 1 and all elements in FIG. 2 similar to those of FIG. 1 have similar reference characters. When the inputs to audio mixer 9 are digital, such as Din1–Din3, the inputs are traditionally applied to respective digital-to-analog converters, D/A, 25–29 before being applied to analog audio mixer 9. An example of such an audio mixer is presented in U.S. Pat. No. 5,647,008 to Farhangi et al. By converting digital inputs Din1–Din3 to the analog domain before mixing, some of the complexities associated with having multiple independently digitized inputs Din1–Din3 can be avoided. These complexities come from having to synchronize the digital inputs or any special circumstances such as the digital inputs not having similar sampling rates, quantization levels, or a common system clock.

Working in the digital domain, however, does offer advantages in terms of consistency and processing flexibility. Since digital processing is designed through a series of processing algorithms that can be implemented in code or digital circuitry, digital processing does not require tuning of components due to ambient changes or aging, as is the case in analog circuitry. Additionally, changes to the processing algorithm can be implemented with minimal or no changes to the digital circuitry. Thus, it is desirable to use the digital domain to process and to mix analog inputs signals.

An example of an audio mixer that processes analog inputs in the digital domain is shown in FIG. 3. All components in FIG. 3 similar to those of FIG. 1 are identified with similar reference characters and are defined above. Analog inputs Ain1–Ain3 are first applied to respective analog-to-digital converters, A/D, 31–35 under control of audio mixer 9. The resultant multi-bit output word from each A/D 31–35 can have its respective weight digitally adjusted by means of respective multipliers 37–41 and respective gain factors G1–G3. For example, multiplier 37 receives a multi-bit word from A/D 31 and multiplies the received word by its respective multi-bit gain factor G1. The multiplied output word from each multiplier 37–41 can be applied directly to a respective digital-to-analog converter 43–47, or can optionally first go through additional, respective processing steps 51–55 before being applied to its respective D/A 43–47. The outputs from each D/A 43–47 are applied to analog summer 17 and follow the same output stage as that of analog mixer 9 of FIG. 1.

The difficulties discussed above in reference to FIG. 2 associated with the mixing of independently digitized input signals are avoided in FIG. 3. This is because all analog inputs Ain1–Ain3 in FIG. 3 are quantized and digitized under control audio mixer 9, and the resultant digitized signals therefore have no unknown characteristics. Nonetheless, the structure of FIG. 3 still converts the multiplied and processed digital signals back to the analog domain before mixing them in summer 17. This is typical in the art (where circuit size is not an issue) and takes advantage of the relatively simple and robust structures of analog summers. A similar audio mixer is found in U.S. Pat. No. 5,438,623 to Begault.

Although not strictly related to the present invention, in order to offer a more complete overview of audio mixers, FIG. 4 shows an example of digital audio mixer 49 for mixing multiple, independently digitized inputs. In this example, a first digital input D1 is shown to have a lower sampling frequency than a second digital input D2. Digital audio mixer 49 also receives an analog input Ain1. To compensate for the unknown digitizing factors associated with each independently digitized input D1 and D2, the digital inputs must be synchronized before being processed and mixed. In the present example, the low sampling frequency of D1 is interpolated, i.e. up-converted, to a selected common factor frequency. Similarly the high frequency of D2 is decimated, i.e. down-converted, to the same selected common factor frequency.

There are various methods of interpolating and decimating digital signals, and typical methods are shown in FIG. 4. First, the sampling clock CLK1 of the A/D 61 is selected as the common factor frequency for synchronizing D1 and D2. CLK1 is applied to an interpolator 57, which receives D1, and applied to a decimator 59, which receives D2. Interpolator 57 adds new sample values in between the incoming D1 samples in order to generate an output sample rate on line 56 at the frequency dictated by CLK1. Various algorithms exist for selecting the new sample values, but this is not critical to the discussion. Decimator 59 likewise produces an output sample rate on line 58 at a frequency determined by CLK1. In the present example, decimator 59 accomplishes this by ignoring, i.e. throwing away, every other incoming D2 sample. A further discussion of decimators and interpolators can be found in *The ARRL Handbook*, 74th Edition, 1997, pages 18.1–18.18.

First digital input D1, second digital D2, and the digitized representation of analog input Ain1 are thus synchronized and ready to be processed. D1, D2 and the output of A/D 61 have their weights individually adjusted by means of respective multiplier circuits 63–67 and respective gain factors G1–G3 before being applied to a digital summer 69. Digital summer 69 produces a mixed audio output at a frequency of CLK1. If this mixed audio output frequency CLK1 is too high for subsequent processing stages, then it may be necessary to down-convert the output frequency of summer 69 by means of a second decimator 70. This and other methods of digitally mixing multiple, independently digitized inputs are further discussed in U.S. Pat. No. 5,647,008 to Farhangi et al. and U.S. Pat. No. 5,729,225 to Ledzius.

FIG. 5 returns to the focus of this application, i.e. the digital mixing of multiple analog inputs. All elements in FIG. 5 similar to those of FIG. 3 have similar reference characters and are defined above. Like in FIG. 3, the structure of FIG. 5 shows analog inputs Ain1–Ain3 applied respective A/D converters 31–35, and the output of each A/D converter 31–35 is applied to a respective multiplier circuit 37–41. Unlike FIG. 3, however, the resultant outputs from multipliers 37–41 in FIG. 5 are applied to a digital summer 71 (accumulator) for mixing within the digital domain. No special circuitry for synchronizing the digitized inputs is necessary since there are no unknown digitizing factors. This is because analog inputs Ain1–Ain3 are directly quantized and digitized under control of the audio mixer 9. Not subjecting the multiplied signals to a D/A conversion before summing, as is down in FIG. 3, is especially advantageous if further digital processing is required in later stages. This is because a signal is degraded every time it undergoes a D/A and A/D conversion. Optionally, however, Dout may be applied to a D/A converter 73 to also provide an analog output Aout. A similar structure is shown in U.S. Pat. No. 5,483,528 to Christensen.

The structure of FIG. 5 has traditionally been limited to the circuit board level due to the complexities and large area requirements of integrated analog sub-circuits. Additionally, digital multipliers 37–41 are likewise large digital circuits requiring large amounts of IC chip area. Thus, providing separate A/D's 31–35 and separate multipliers 37–41 for each input Ain1–Ain3 makes integration of the structure of FIG. 5 into a single IC chip prohibitive.

An approach toward facilitating the integration of A/D converters in an IC is to limit the number of analog circuit stages. One method of doing this is through an over-sampling technique wherein one trades the high frequency capability of integrated digital circuits in exchange for fewer quantization levels, and hence fewer analog sub-circuits.

An effective over-sampling analog-to-digital converter well suited for IC integration is the delta-sigma, Δ/Σ, analog-to-digital converter shown in FIG. 5. Each Δ/Σ A/D, 31–35, includes a delta-sigma modulator 72 followed by a sigma-decimation filter 74. A delta-sigma modulator 72 samples an input signal at many times the input signal's Nyquist frequency. As the sampling frequency is increased, the quantization levels, and hence bit-resolution, may be reduced. A typical Δ/Σ modulator 72 has a one-bit resolution. The resultant one-bit data stream is collected by sigma-decimation filter 74, which includes a low-pass filter and resampler, and is typically based on IIR or FIR structures. Sigma-decimation filter 74 removes out-of-band quantization noise and then resamples at the Nyquist frequency to obtain a rate reduction, or decimation. In effect, the sigma-decimation filter 74 subdivides the incoming one-bit data stream from delta-sigma modulator 72 into large groups of one-bit samples, and then reshapes and combines each large group of one-bit samples to produce a composite multi-bit output with a typical resolution greater than 10 bits. A more detailed discussion of delta-sigma modulators and sigma-decimation filters in the construction of analog-to-digital converters is found in *Analog VLSI: Signal and Information Processing*, by Ismail et al., 1994, pages 467–505.

It is unfortunate that the term "decimation" is used in the art to refer to both the traditional decimation filter 59 of FIG. 4 and the sigma-decimation filter 74 FIG. 5. The two decimating filter circuits 59 and 74 are actually very different in objective, functionality and design. A detailed comparison of the two decimation filters 59 and 74 is beyond the scope of this paper. It should be noted, however, that the objective of the traditional decimation filter 59 is to meet a certain frequency response specification, typically by throwing away every-so-many samples of an incoming signal. By contrast, the objective of the sigma-decimation filter 74 is to suppress output-of-band quantization noise and to reconstruct a data word having a higher bit-resolution than the incoming signal.

In spite of the integratability of delta-sigma analog-to-digital converters, however, they are still very large and complicated circuits. This makes the notion of including a separate delta-sigma analog-to-digital converter for each analog input in an IC impractical both in terms of real estate and cost.

One approach towards reducing the number of delta-sigma analog-to-digital converters per input is shown in FIG. 6. Here, multiple analog inputs Ain1–Ain3 time-share a single delta-sigma analog-to-digital converter 77. Input signals Ain1–Ain3 are applied to a multiplexer 75, which alternates access to the single Δ/Σ A/D 77. The output from Δ/Σ A/D 77 then goes through a demultiplexer 79 and is applied to a selected one of digital output signals Dout1–Dout3. This structure, however, limits the frequency of input signals Ain1–Ain3 since they must be slow enough to sequentially share a single Δ/Σ A/D 77. This severely restricts its use in audio applications, and has traditionally been used in control systems to monitor slow varying variables such as temperature changes. Additionally, since the outputs Dout1–Dout3 are generated piecemeal sequentially, the structure does not lend itself to an audio mixer circuit, which requires that its input signals be supplied simultaneously in order to be mixed together. More information on this type of multi-input, delta-sigma analog-to-digital converter is found in U.S. Pat. No. 5,345,236 to Sramek Jr. and U.S. Pat. No. 5,561,425 to Therssen.

It is an object of the present invention to provide audio mixer structure that is suitable for integration into a single IC and can digitally mix multiple analog inputs.

It is another object of the present invention to provide an integrated audio mixer which uses delta-sigma type analog-to-digital converters, but which does not suffer from the large real estate requirements of traditional delta-sigma A/D structures.

It is still a third objective of the present invention to provide a structure that permits multiple, different analog inputs to share sub-components of a delta-sigma analog-to-digital converter without placing any additional frequency limitations on the input signals.

SUMMARY OF THE INVENTION

The above objects are met in a multi-input audio mixer receiving a plurality of analog input signals, internally digitizing the analog input signals, digitally processing and mixing the digitized input signals, and producing both digital and analog representations of the mixed inputs. All analog inputs are applied to half of a complete delta-sigma analog-to-digital converter. That is, all analog inputs are initially quantized by being applied to a respective delta-sigma modulator, but the delta-sigma modulator is not followed by a sigma-decimation filter so that the A/D conversion is not completed at this stage. Each delta-sigma modulator preferably produces a 1-bit binary data stream.

To reduce the IC area requirements, no multipliers are used in adjusting the gain of an input signal. The weight coefficient of each input signal is adjusted by assigning a number to the logic state output of each delta-sigma modulator. In other words, the logic high state and logic low state of each 1-bit data stream is individually assigned a magnitude value. The logic low magnitude values are negative and are further represented in two's complement notation. To accomplish this, each 1-bit data stream is associated with a pair of coefficient registers in which the magnitude value, or weight, of a binary high state and a binary low state are respectively stored. Each pair of coefficient registers is coupled to a corresponding 2-to-1 multiplexer controlled by a respective 1-bit binary data stream. The content of one of the two coefficient registers is selectively transferred to a summation (mixing) apparatus in response to the logic state of its respective 1-bit data stream.

The IC area requirements are further reduced because the delta-sigma analog-to-digital converters of the present invention do not have individual decimation filters, as was mentioned above. Rather, all delta-sigma modulators share a single decimation filter. After all input channels are mixed by the summing apparatus, the resultant, multi-bit mixed signal is applied to a single decimation filter that produces a multi-bit, output data word. The multi-bit mixed signal from the summing apparatus is also applied to a digital-to-analog converter to produce an analog output.

BEST MODE FOR CARRYING OUT THE INVENTION

Figure 7:
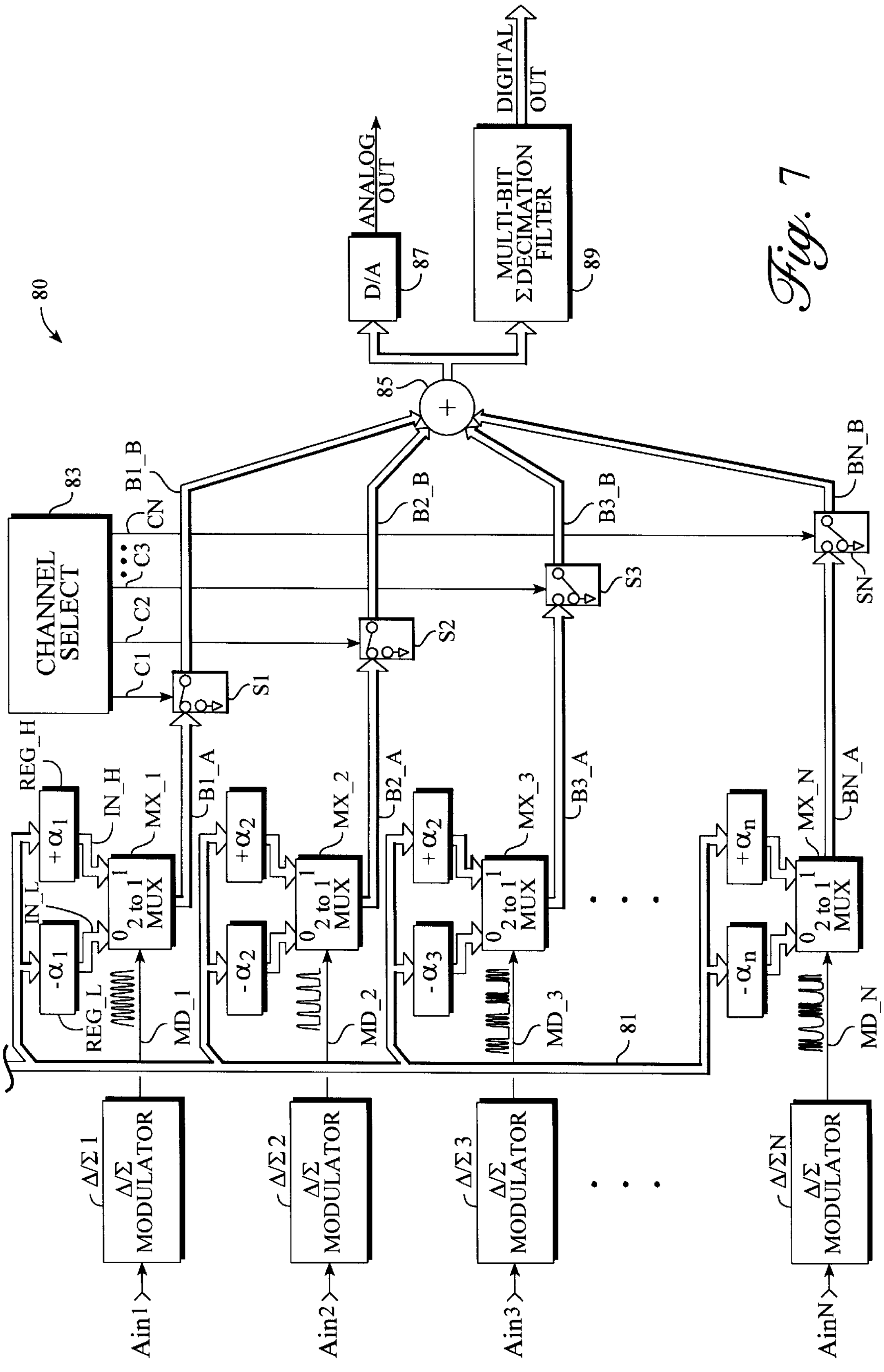
FIG. 7 is a digital audio mixer in accord with the present invention for mixing multiple analog inputs.

With reference to FIG. 7, a digital analog mixer 80 in accord with the present invention well suited for integration onto a single IC chip is shown. Audio mixer 80 breaks up the traditional delta-sigma analog-to-digital converter into its constituent parts, and then uses the constituents parts separately. As was explained above, a traditional, full delta-sigma analog-to-digital converter consists of two sub-components; the first sub-component, a delta/sigma modulator, is followed by the second sub-component, a sigma-decimation filter. This full delta/sigma analog-to-digital converter structure is relatively large and requires a large amount of IC real estate. Applicants have found that the most expensive component of a full delta/sigma analog-to-digital converter in terms of both IC chip area and complexity is the sigma-decimation filter. Thus, the present invention reduces the complexity and size of multiple delta/sigma analog-to-digital converters by minimizing the number of sigma-decimation filters required. The present invention further reduces the area requirements of an integrated audio mixer by eliminating the need for multipliers, which traditionally are large digital sub-circuits limiting the number of inputs to an integrated audio mixer.

Unlike the prior art, which requires that all analog inputs be applied to individual full delta/sigma analog-to-digital converters, the present invention applies each analog input Ain1–AinN only to the first sub-component of a traditional full delta/sigma analog-to-digital converter, i.e. the delta/sigma modulator, Δ/Σ1 to Δ/ΣN. In other words, each analog input Ain1–AinN is applied to a respective delta/sigma modulator Δ/Σ1 to Δ/ΣN that is not followed by a respective sigma-decimation filter. Each delta/sigma modulator Δ/Σ1 to Δ/ΣN converts its respective analog input Ani1–AinN into a preferably one-bit data stream alternating between a logic high and a logic low on its respective output line $MD_{13}$ 1 to $MD_{13}$ N. Many examples of one-bit delta/sigma modulators suitable for the present invention are known in the art.

Figure 1:
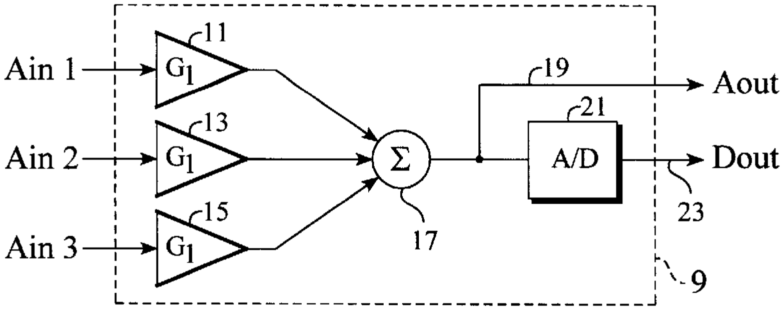
Fig. 1 (Prior Art)
FIG. 1 is a typical analog audio mixer.
Figure 2:
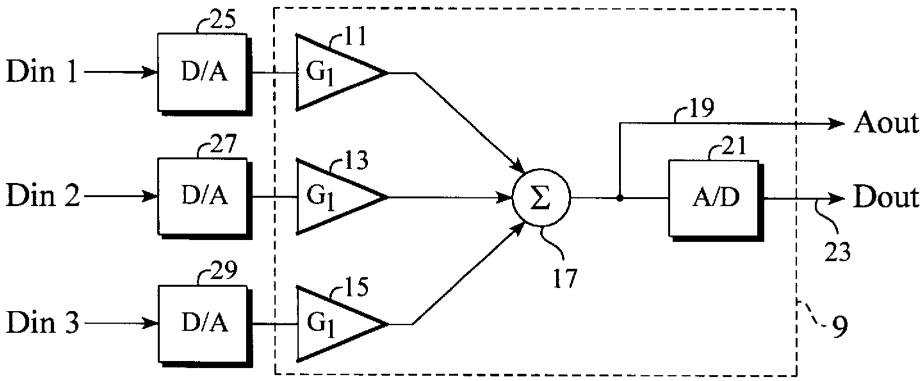
Fig. 2 (Prior Art)
FIG. 2 is a prior art analog audio mixer for mixing digital inputs.
Figure 3:
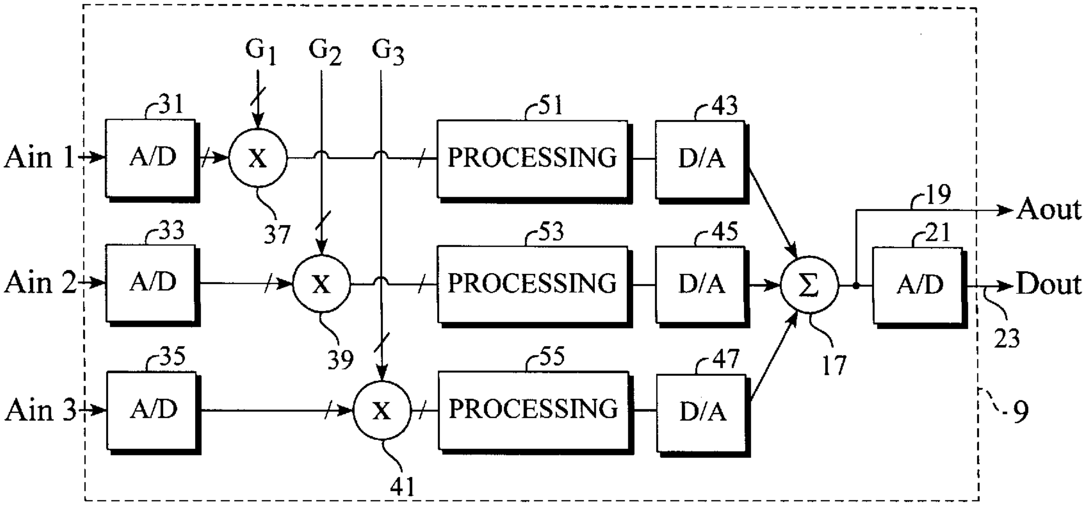
Fig. 3 (Prior Art)
FIG. 3 is a typical digital and analog mixed-technology audio mixer.
Figure 4:
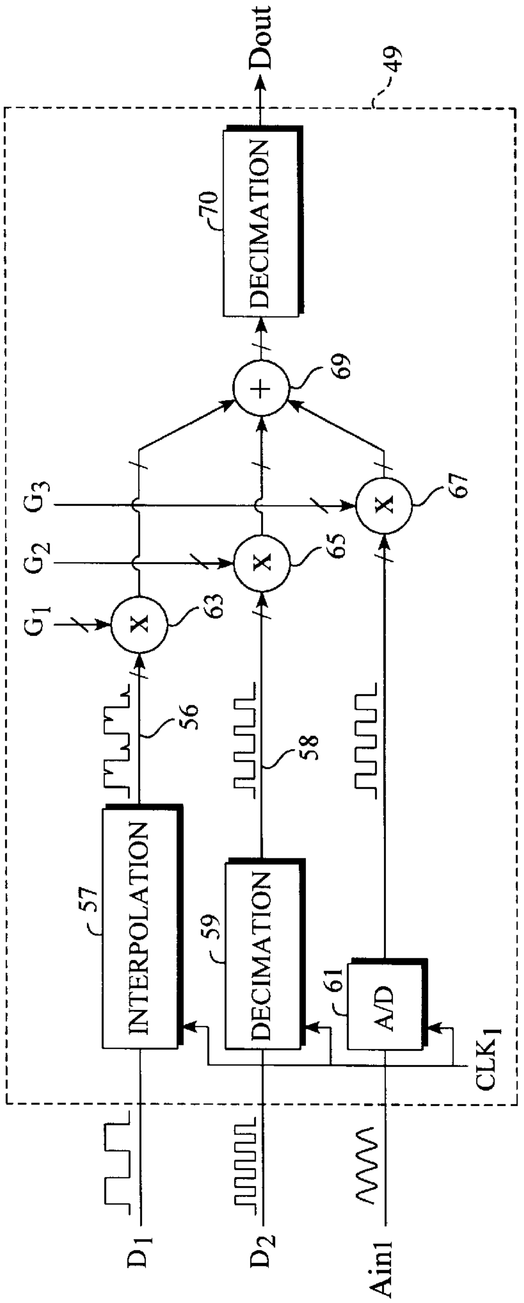
Fig. 4 (Prior Art)
FIG. 4 is a prior art digital audio mixer for independently digitized inputs.
Figure 5:
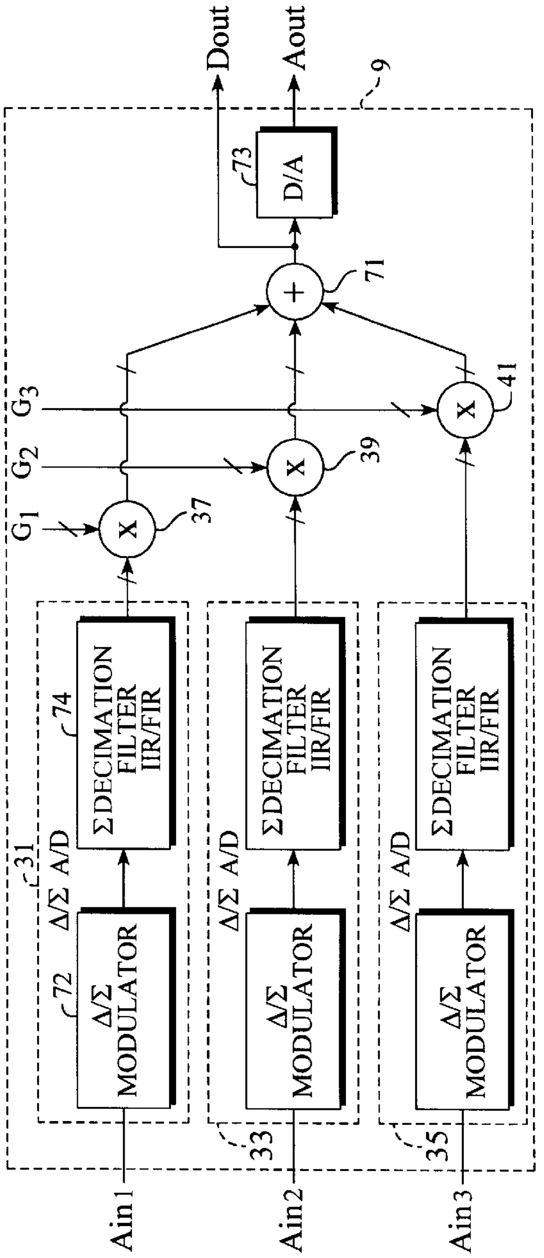
Fig. 5 (Prior Art)
FIG. 5 is a prior art digital audio mixer, which itself digitizes its analog inputs.
Figure 6:
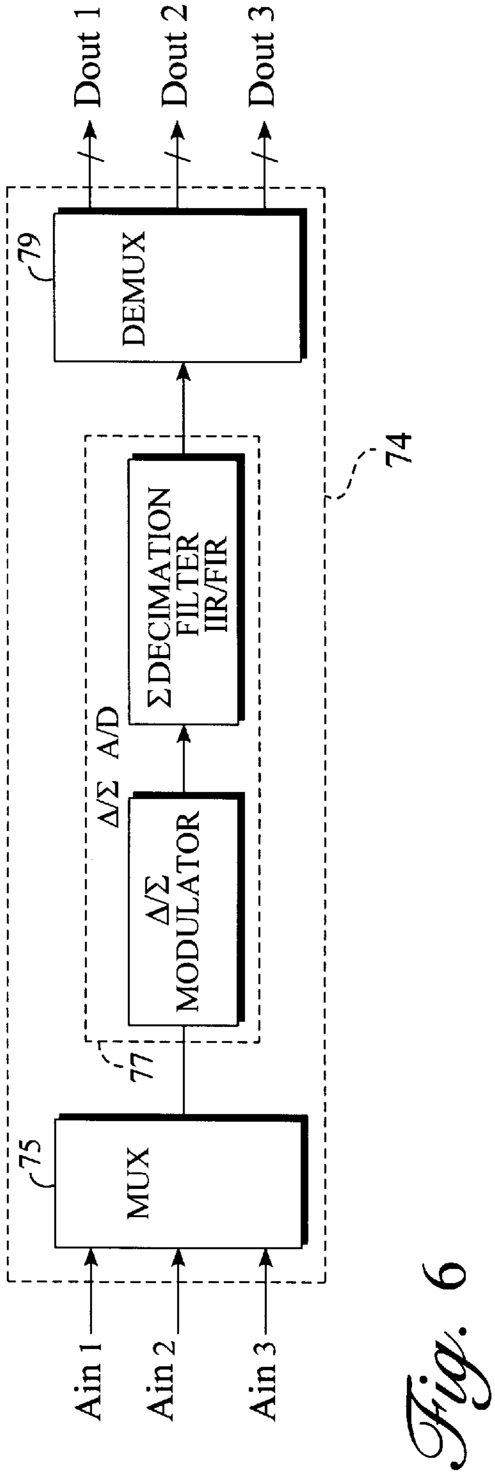
Fig. 6 (Prior Art)
FIG. 6 is a traditional delta-sigma analog-to-digital converter capable of receiving multiple inputs.
Figure 8:
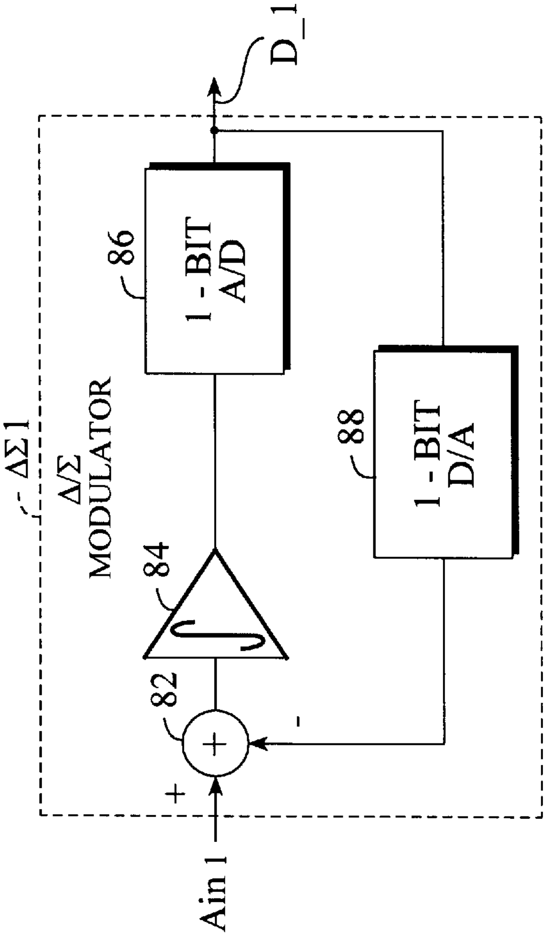
FIG. 8 is a block diagram of a delta/sigma modulator.

For illustrative purposes, FIG. 8 shows a block diagram of a basic one-bit delta/sigma modulator described in *Analog VLSI Signal and Information Processing*, Ismail et al., 1994, Chapter 10. As explained by Ismail et al., the delta/sigma modulator ΔΣ1 is a noise shaping oversampled modulator with an internal quantizer. A typical delta/sigma modulator consists of a summing node 82, an integrator 84, a one-bit A/D converter 86, and a one-bit D/A converter 88 in a feedback loop. Since the integrator 84 has infinite gain at dc, the loop gain is infinite at dc, and therefore the dc-component of the average of the error signal is zero. Consequently, the dc-component or the average of the output from the D/A 88 will be identical to the dc-component of the input signal Ain1. This means that even though the quantization error at every sample is large because a quantizer with only two levels is used, the average of the quantized signal, and therefore the modulator output on line $D_{13}$ 1, tracks the analog input signal Ain1. This average would typically be computed by a sigma-decimation filter that would normally follow the delta/sigma modulator in a full delta/sigma analog-to-digital converter.

In general, the output of integrator 84 ramps up and down according to the value of D/A 88. Correspondingly, one-bit A/D 86 outputs a bit stream of ones and zeroes which is a pulse density modulated representation of the input dc-value. For example, if the input Ain1 is 1/7V and the initial condition of integrator 84 is zero, the output sequence on line D_1 for the first 20 cycles may be: 0, 0, 0, 0, 1, 0, 0, 0, 0, 0, 0, 1, 0, 0, 0, 0, 0, 0, 1, 0. The average value of this output sequence approaches 1/7. The resolution of the converter increases when more samples are included in the averaging process, or as one increases the ratio of the sampling frequency to the Nyquist rate.

Since the outputs MD_1 to MD_2 in FIG. 8 are not applied to a respective sigma-decimation filter for recovering a numerical equivalent and since they are one-bit-wide bit streams, their weight, i.e. gain, cannot be adjusted by means of multipliers, as is typically done in the art. To overcome this limitation, the present invention uses multiplexers MX_1 to MX_N to modify the weight of each one-bit data stream MD_1 to MD_N before they are collected and recovered into an equivalent multi-bit word by a sigma-decimation filter. Alternatively, if it is not desired to adjust the weight of data streams MD_1 to MD_N, the data streams may be directly connected to summing circuit 85.

However, in the presently preferred embodiment, each modulation output line MD_1 to MD_N controls a respective multiplexer MX_1 to MX_N. Each multiplexer, MX_1 to MX_N, responds to a logic high or logic low on its respective MD_1 to MD_N control line by selectively transferring one of two multi-bit inputs IN_L and IN_H to its respective output bus B1_A to BN_A. By adjusting the value of the multi-bit inputs, IN_L and IN_H, one can adjust the weight of a respective one-bit data stream on lines MD_1 to MD_N.

The weights of logic low signals on each of lines MD_1 to MD_N are stored in respective first registers Reg_L. Registers Reg_L are coupled to input IN_L of respective multiplexers MX_1 to MX_N. Similarly, the weights of logic high signals on each of lines MD_1 to MD_N are stored in respective second registers Reg_H. Registers Reg_H are likewise coupled to input IN_H of respective multiplexers MX_1 to MX_N. The values of registers Reg_H and Reg_L may be updated by means of a register bus 81.

The output bus B1_A to BN_A of each multiplexer is selectively transferred to a corresponding summing bus B1_B to BN_B by means of a respective active switch bank S1–SN. Each active switch bank S1–SN is individually controlled by means of a channel selector 83. For example, if channel select output C1 has a logic high then it will actuate the respective active switch bank S1 and couple multiplexer output bus B1_A to summing bus B1_B. Similarly, if channel bus select output C3 has a logic low, then it will cause switch bank S3 to not only disconnect multiplexer output bus B3_A from summing bus B3_B, but also to ground all lines of summing bus B3_B.

Figure 9:
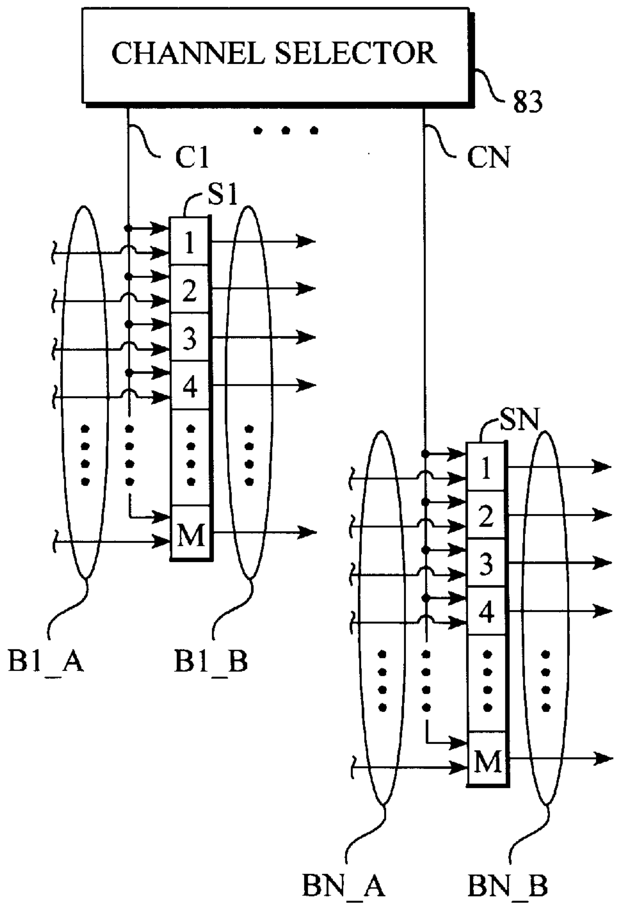
FIG. 9 is a close-up view of a switch bank from FIG. 7.

This is better illustrated with reference to FIGS. 9 and 10. FIG. 9 shows a close-up view of channel selector 83 controlling bus pair B1_A/B1_B and bus pair BN_A/BN_B. Switch bank S1 is shown to consist of multiple modules ranging from 1 to M. The bus size of switch banks S1–SN is equal to the size of a multi-bit word from weight registers Reg_L and Reg_H and hence equal to multiplexer output buses B1_A to BN_A. Each module 1 to M individually transfers a respective line from bus B1_A to bus B1_B. All modules within switch bank S1 are simultaneously controlled by a respective channel select line C1. Similarly, channel select line CN controls switch bank SN and thereby controls buses BN_A and BN_B. If a channel select line, such as C1, has a logic high, then all modules 1 to M within switch bank S1 will couple their respective B1_A line to their respective B1_B line. If, on the other hand, C1 has a logic low, then all modules 1 to M within switch bank S1 will isolate their respective B1_A line from their respective B1_B line and additionally couple their respective B1_B line to ground.

Figure 10:
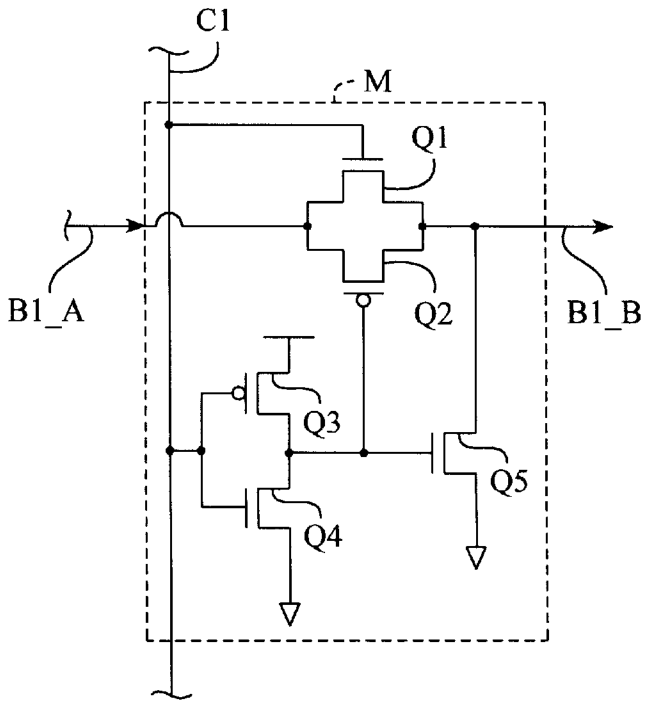
FIG. 10 is circuit implementation of the switch bank of FIG. 9.

FIG. 10 shows an example of one implementation of a switch module M within switch banks S1–SN. An input line from bus B1_A is shown coupled to one side of transistors Q1 and Q2. Transistors Q1/Q2 along with inverter Q3/Q4 constitute a transmission gate. Channel select line C1 controls the transmission gate. C1 is connected to NMOS transistor Q1 and to the input of inverter Q3/Q4. The output of inverter Q3/Q4 is coupled to the control gates of PMOS transistor Q2 and NMOS pull-down transistor Q5. The output from transistors Q1/Q2 is coupled to one line of bus B1_B, and transistor Q5 selectively coupled the same line of bus B1_B to ground. If C1 has a logic high, then it will directly turn on NMOS transistor Q1 while causing inverter Q3/Q4 to apply a logic low on PMOS transistor Q2 and NMOS transistor Q5. This causes PMOS transistor Q2 to also turn on, but causes NMOS transistor Q5 to turn off. Thus, Q1 and Q2 together couple the line from bus B1_A to the corresponding line of bus B1_B. If C1 has a logic low, then it will directly turn off Q1 and cause inverter Q3/Q4 to place a logic high on PMOS transistor Q2 and NMOS transistor Q5. This causes PMOS transistor Q2 to also turn off, but causes NMOS pull-down transistor Q5 to turn on. Thus, Q1 and Q2 together isolate the line of bus B1_A from its corresponding line of bus B1_B while Q5 couples the same corresponding line of bus B_B to ground.

Returning to FIG. 7, all summation buses B1_B to BN_B are applied to a digital summer circuit 85. As explained above, any input Ain1 to AinN which is disconnected from its respective summing bus B1_B to BN_B will have its respective summing bus line tied to ground and thereby apply a numerical zero to summing circuit 85. Thus, any input can be quickly removed from summing circuit 85 merely by placing a logic low on the appropriate channel select line C1–CN. The output of summer 85 contains a mixed, high frequency, multi-bit, weighted representation of the inputs Ain1–AinN.

As stated above, analog inputs Ain1–AinN are not applied to full delta/sigma analog-to-digital converters. They are applied only to delta/sigma modulators Δ/Σ1 to Δ/ΣN, the first stage of a full delta/sigma analog-to-digital converter. Thus, the bit streams on summation buses B1_B to BN_B are mixed, i.e. summed, before they have been applied to a sigma-decimation filter. Applicants have found, however, that it is possible for the sum of multiple analog inputs Ain1–AinN applied to respective delta/sigma modulators MX_1 to MX_N in a mixing circuit 80 to share a single sigma-decimation filter 89 without loss of data. The output from summing circuit 85 is also applied to a digital-to-analog converter, smoothing filter 87, to provide an analog representation of the digitally mixed analog input Ain1–AinN. Preferably, audio mixer 80 is integrated onto a single integrated circuit chip.

Since the one-bit data stream from each delta/sigma modulator Δ/Σ1 to Δ/ΣN is converted into weighted, multi-bit data streams by respective multiplexers MX_1 to MX_N, sigma-decimation filter 89 receiving the resultant mix data should be capable of processing multi-bit data words. Such multi-bit sigma-decimation filters are known in the art and are typically implemented immediately following a single multi-bit Δ/Σ modulator in prior art multi-bit, full Δ/Σ analog-to-digital converters. In the present case, however, Applicants are using a multi-bit sigma-decimation filter to follow multiple 1-bit Δ/Σ modulators.

In principle, multi-bit sigma-decimation filter 89 is similar to basic 1-bit sigma-decimation filters in that it consists of a low pass filter and resampler. Upon filtering, the signal is resampled at the Nyquist frequency. The purpose of the filter is to remove out-of-band quantization nose and to suppress spurious out-of-band signals while reconstructing a multi-bit word out of a set of many samples. The rate reduction, or decimation is usually performed in two or more steps to increase the ratio of the width of the transition band of the filter to the sampling rate, and thereby decreasing the order of the individual filters. As explained above, a sigma-decimation filter design differs from the traditional decimation filter design in that the desired objective is to suppress out-of-band quantization noise as opposed to meeting a certain frequency response specification.

Figure 11:
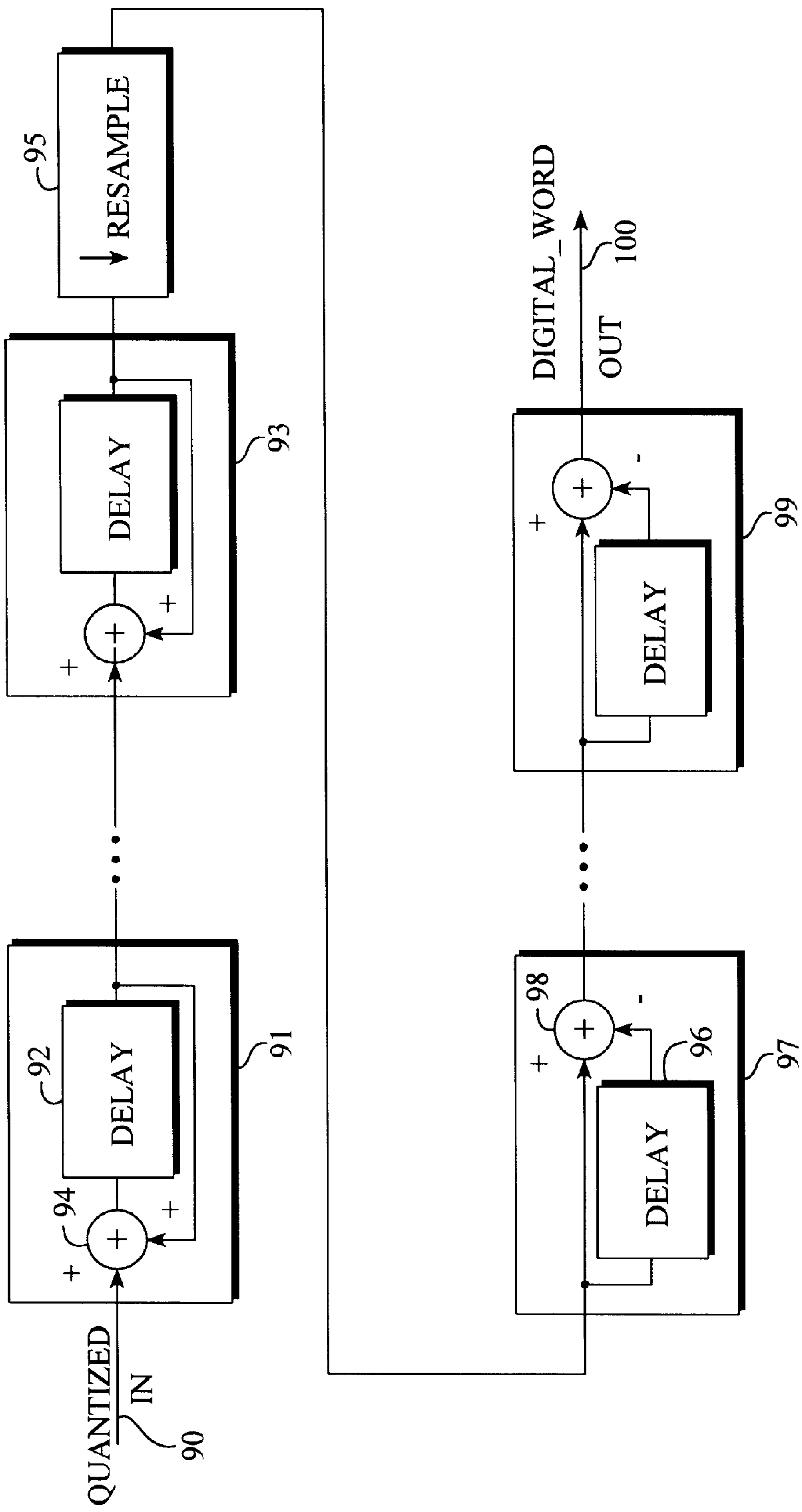
FIG. 11 is a block diagram of a sigma-decimation filter.

In the case of sigma-delta modulators whose power spectral density of quantization noise has a sinusoidal response, the sigma-decimation filter can be efficiently implemented using a cascade of comb filters. This type of decimation filter exhibits a sinc-type frequency response. A general block diagram of such a filter is shown in FIG. 11. A quantized input is applied to a cascade of integrators 91 to 93. Each integrator 91 to 93 includes a feedback delay element 92 and a summer 94. The resultant output is then applied to a resample unit 95, which decimates the incoming bit-stream. The decimated output from resample unit 95 is applied to a cascade of differentiators 97 to 99. Each differentiator includes a feedforward delay 96 and a summer 98.

The general structure of the sigma-decimation filter shown in FIG. 11 is likewise applicable to multi-bit sigma-decimation filters, such as filter 89 of FIG. 7. Many examples of such multi-bit sigma-decimation filters are known in the art. An example of a multi-bit sigma-decimation filter is shown in U.S. Pat. No. 5,751,615 to Brown, incorporated herein by reference.

What is claimed is:

1. An audio signal mixer comprising:

a delta/sigma modulator having multiple quantization levels, said delta/sigma modulator having an input node for receiving an analog signal and having a quantized output producing one of said quantized levels in response to said analog input node;

a multiplexer having a control input responsive to said quantized output, said multiplexer having multiple input channels and one output channel, each of said input channels corresponding to one of said quantization levels of said delta/sigma modulator, said multiplexer being effective for selectively coupling a corresponding one of said input channels to said output channel in response to said quantized output; and a summer circuit having an input bus and an output bus, said input bus being coupled to said output channel of said multiplexer.

2. The audio signal mixer of claim 1 further including a sigma-decimation filter, said output bus of said summing circuit being coupled to the input of said sigma-decimation filter.

3. The audio signal mixer of claim 1 wherein said delta/sigma modulator has a one bit resolution and whose quantized output alternates only between a first quantization level and second quantization level.

4. The audio signal mixer of claim 3 wherein the multiplexer's input channel corresponding to said first quantization level receives a positive number and its input channel corresponding to said second quantization level receives a negative number.

5. The audio signal mixer of claim 4 wherein said input channels of said multiplexers are supplied by separate data registers.

6. The audio signal mixer of claim 5 wherein said negative number is implemented in two's complement notation.

7. The audio signal mixer of claim 1 further including a plurality of data registers, each of said data registers having its contents coupled to a corresponding one of said multiple input channels of said multiplexer.

8. The audio signal mixer of claim 1 wherein said output channel of said multiplexer is selectively coupled to said input bus of said summer circuit by a switching means.

9. The audio signal mixer of claim 8 wherein said switching means is further effective for placing a predetermined quantization level on said input bus of said summer circuit whenever said switching means is not coupling said data output channel to said input bus.

10. The audio signal mixer of claim 8 wherein said switching means is responsive to a channel selector.

11. The audio signal mixer of claim 1 further including a digital-to-analog converter receiving said output bus of said summer circuit and producing an analog representation of the contents on said output bus.

12. The audio signal mixer of claim 1 further being a part of a single integrated circuit.

13. The audio signal mixer of claim 1 further having multiple said delta/sigma modulators with each of said multiple delta/sigma modulators having its output connected directly to a separate, respective multiplexer, each of said delta/sigma modulators having a separate input node independent of any other.

14. An integrated signal mixer circuit comprising:

a plurality of 1-bit delta/sigma modulators, each of said delta/sigma modulators having a separate input node for receiving a separate analog signal, each of said delta/sigma modulators further having a quantized output line alternating between a first logic state and a second logic state in response to its input node;

a plurality of 2-to-1 multiplexers each having a control input coupled to a separate one of said quantized output lines from a corresponding one of said plurality of delta/sigma modulators, each of said multiplexers having a first MUX input channel, a second MUX input channel and a MUX output channel, each of said multiplexers being effective for transferring its respective first MUX input channel to its respective MUX output channel in response to its control input receiving said first logic state and effective for transferring its second MUX input channel to its MUX output channel in response to its control input receiving said second logic state;

a plurality of summing buses;

a plurality of switch banks selectively coupling a respective one of said MUX output channels to a corresponding one of said plurality of summing buses; and a summing circuit receiving all of said summing buses, said summing circuit being effective for summing together the contents of all of said summing buses and placing the resultant sum total on an output bus.

15. The integrated signal mixer circuit of claim 14 further comprising a sigma-decimation filter receiving said output bus from said summing circuit.

16. The integrated signal mixer circuit of claim 14, wherein said plurality of switch banks are further effective for placing said first logic state on their corresponding summing bus whenever they are not coupling their respective data output bus to their respective summing bus.

17. The integrated signal mixer circuit of claim 14 wherein each of said first and second MUX inputs of said plurality of 2-to-1 multiplexers is supplied by separate data register.

18. The integrated signal mixer circuit of claim 17 wherein any negative numbers in said data registers are implemented in two's complement notation.

19. The integrated signal mixer circuit of claim 14, wherein each of said plurality of switch banks is individually controlled by a channel selector circuit.

* * * * *